(12) United States Patent  
Gowda et al.

(10) Patent No.: US 9,299,630 B2
(45) Date of Patent: Mar. 29, 2016

(54) DIFFUSION BARRIER FOR SURFACE MOUNT MODULES

(75) Inventors: Arun Virupaksha Gowda, Rexford, NY (US); Paul Alan McConnelee, Albany, NY (US); Ri-an Zhao, Niskayuna, NY (US); Shakti Singh Chauhan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 428 days.

(21) Appl. No.: 13/561,868

(22) Filed: Jul. 30, 2012

(65) Prior Publication Data

US 2014/0029210 A1 Jan. 30, 2014

(51) Int. Cl.
*H01L 23/02* (2006.01)
*H01L 23/31* (2006.01)
(Continued)

(52) U.S. Cl.
CPC ........ *H01L 23/3121* (2013.01); *H01L 21/4853* (2013.01); *H01L 23/3735* (2013.01); *H01L 23/49816* (2013.01); *H01L 23/49833* (2013.01); *H01L 23/49894* (2013.01); *H01L 23/5389* (2013.01); *H01L 24/19* (2013.01); *H01L 24/20* (2013.01); *H01L 24/24* (2013.01); *H01L 21/561* (2013.01); *H01L 23/564* (2013.01); *H01L 2224/12105* (2013.01); *H01L 2224/131* (2013.01); *H01L 2224/13022* (2013.01); *H01L 2224/24137* (2013.01); *H01L 2224/291* (2013.01); *H01L 2224/293* (2013.01); *H01L 2224/2929* (2013.01);
(Continued)

(58) Field of Classification Search
None
See application file for complete search history.

(56) References Cited

U.S. PATENT DOCUMENTS 5,250,843 A 10/1993 Eichelberger
5,926,696 A * 7/1999 Baxter et al. .................. 438/118
(Continued)

FOREIGN PATENT DOCUMENTS

WO 2005051525 A1 6/2005
WO 2011103341 A1 8/2011

OTHER PUBLICATIONS

Jensen, "Ultra-Thin Moisture Barrier Coatings for Passive Components," Abstract, Massachusetts Institute of Technology, Jun. 2004, p. 1.
(Continued)

*Primary Examiner* — Mamadou Diallo
*Assistant Examiner* — Jay C Chang
(74) *Attorney, Agent, or Firm* — Ziolkowski Patent Solutions Group, SC; Jean K. Testa

(57) ABSTRACT

A surface-mount package structure for reducing the ingress of moisture and gases thereto is disclosed. The surface-mount structure includes a sub-module having a dielectric layer, semiconductor devices attached to the dielectric layer, a first level interconnect structure electrically coupled to the semiconductor devices, and a second level I/O connection electrically coupled to the first level interconnect and formed on the dielectric layer, with the second level I/O connection configured to connect the sub-module to an external circuit. The semiconductor devices of the sub-module are attached to a substrate structure, with a dielectric material positioned between the dielectric layer and the substrate structure to fill in gaps in the surface-mount structure. A diffusion barrier layer is applied over the sub-module, adjacent the first and second level I/O connections, and extends down to the substrate structure to reduce the ingress of moisture and gases from a surrounding environment into the surface-mount structure.

23 Claims, 10 Drawing Sheets

(51) Int. Cl.
*H01L 23/538* (2006.01)
*H01L 23/373* (2006.01)
*H01L 23/498* (2006.01)
*H01L 21/48* (2006.01)
*H01L 23/00* (2006.01)
*H01L 21/56* (2006.01)

(52) U.S. Cl.
CPC ............... *H01L 2224/32225* (2013.01); *H01L 2224/73267* (2013.01); *H01L 2224/83192* (2013.01); *H01L 2224/83855* (2013.01); *H01L 2224/9222* (2013.01); *H01L 2224/92144* (2013.01); *H01L 2224/97* (2013.01); *H01L 2924/12042* (2013.01); *H01L 2924/15787* (2013.01); *H01L 2924/181* (2013.01)

(56) References Cited

U.S. PATENT DOCUMENTS

| | | |
|---|---|---|
| 6,154,366 A | 11/2000 | Ma et al. |
| 6,306,680 B1 | 10/2001 | Fillion et al. |
| 7,015,640 B2 | 3/2006 | Schaepkens et al. |
| 7,688,497 B2 | 3/2010 | Danner et al. |
| 7,733,554 B2 | 6/2010 | Danner et al. |
| 2003/0077951 A1* | 4/2003 | Sturgeon et al. ............... 439/862 |
| 2005/0046079 A1* | 3/2005 | Murugan ................... 264/272.17 |
| 2006/0177098 A1* | 8/2006 | Stam .............................. 382/104 |
| 2007/0138651 A1* | 6/2007 | Hauenstein ................... 257/782 |
| 2007/0295387 A1 | 12/2007 | Adriani et al. |
| 2011/0233690 A1* | 9/2011 | Feiertag et al. ................ 257/414 |

OTHER PUBLICATIONS

Kokko et al, "Thermal Cycling of Flip Chips on FR-4 and PI Substrates with Parylene C Coating," Surface Mount Technology, vol. 22, No. 3, 2010, pp. 42-48.

Wu et al., "Interface-Adhesion-Enhanced Bi-Layer Conformal Coating for Avionics Application," Proceedings International Symposium on Advanced Packaging Materials: Processes, Properties and Interfaces, Mar. 14-17, 1999, pp. 302-310.

Kaltenpoth et al., "The Effect of PECVD SiN Moisture Barrier Layers on the Degradation of a Flip Chip Underfill Material," Soldering & Surface Mount Technology, vol. 13, No. 3, 2001, pp. 12-15.

Huang et al., "Effect of Organic/Inorganic Coating on Moisture Diffusion in a Chip-On-Board Package with Globtop," Journal of Electronic Materials, 2004, vol. 33, No. 2, 2004, pp. 101-105.

* cited by examiner

DIFFUSION BARRIER FOR SURFACE MOUNT MODULES

BACKGROUND OF THE INVENTION

Embodiments of the invention relate generally to structures and methods for packaging semiconductor devices and, more particularly, to a surface-mount packaging structure that includes a diffusion barrier coating.

Surface-mount technology is a method for constructing electronic circuits in which surface mount components or packages are mounted directly onto the surface of printed circuit boards (PCBs) or other similar external circuits. In the industry, surface-mount technology has replaced the through-hole technology construction method of fitting components with wire leads into holes in the circuit board.

One common type of component that is surface-mounted is a power semiconductor device, which is a semiconductor device used as a switch or rectifier in power electronic circuits, such as switched mode power supplies, for example. Most power semiconductor devices are only used in commutation mode (i.e., they are either on or off), and are therefore optimized for this. Many power semiconductor devices are used in high voltage power applications and are designed to carry a large amount of current and support a large voltage. In use, high voltage power semiconductor devices are surface mounted to an external circuit by way of a power overlay (POL) packaging and interconnect system, with the POL package also providing a way to remove the heat generated by the device and protect the device from the external environment.

A standard POL package manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s), so as to form a POL sub-module. The metal interconnects may be in the form of a low profile (e.g., less than 200 micrometers thick), planar interconnect structure that provides for formation of an input/output (I/O) system to and from the power semiconductor device(s). The POL sub-module is then soldered to a ceramic substrate (Alumina with DBC, AlN with AMB Cu, etc.) using soldered interconnection for electrical and thermal connectivity. The gaps around the semiconductor between the POL dielectric layer and the ceramic substrate are then filled using a dielectric organic material using either capillary flow (capillary underfill), no-flow underfill or injection molding (molding compounds) to form the POL package.

It is recognized that POL packages are susceptible to moisture, as moisture in the environment may be absorbed by the materials in the POL package. For example the module may absorb moisture within the bulk of Kapton-adhesive layers and organic dielectric material (i.e., underfill, molding compound, etc.) and at the interfaces created by these materials within the package. When soldering the POL module with absorbed moisture to a circuit board, temperatures in the range of 210-260 degrees Celsius are reached and, at these temperatures, the vapor pressure of the moisture in the POL package increases rapidly. This increase in vapor pressure can cause delamination, "pop-corning" and failure if the moisture is excessive. Additionally, in long term storage and use while exposed to moisture, excessive moisture absorption by the POL package and corrosion at dissimilar material interfaces within the package may lead to electrical and mechanical failures due to increased leakage currents and can also cause mechanical damage on interconnects due to swelling of the POL module upon reflow during board-assembly operations.

Long term operating/storage at elevated temperatures in air (or oxygen-rich environments) or with exposure to toxic/corrosive gasses may also affect the long term life and functionality of the POL modules. With oxygen ingress at elevated temperatures, various interfaces can degrade and the mechanical/electrical/thermal performance of the module may be severely affected. As an example, the adhesion between POL metal (Cu) and Kapton is strongly affected by exposure to oxygen at elevated temperatures, with degradation of adhesion strength being seen within 1000 hrs of storage at temperatures between 200 C-250 C. The inclusion of a robust diffusion barrier can slow down the ingress of oxygen (or other degrading gases) and increase the long-term life of the modules.

Therefore, it would be desirable to provide a surface-mount package having a diffusion barrier that reduces the ingress of moisture and gases into the package, so as to provide enhanced reliability to moisture-related and gas-related failure mechanisms. It would further be desirable for such a diffusion barrier to be introduced during various stages of manufacture of the surface-mount package.

BRIEF DESCRIPTION OF THE INVENTION

Embodiments of the invention overcome the aforementioned drawbacks by providing a surface-mount package structure that includes a diffusion barrier coating configured to reduce the ingress of moisture and gases from a surrounding environment into the surface-mount structure.

In accordance with one aspect of the invention, a surface-mount structure includes a sub-module having a dielectric layer, at least one semiconductor device attached to the dielectric layer that includes a substrate composed of a semiconductor material, a first level metal interconnect structure electrically coupled to the at least one semiconductor device that extends through vias formed through the dielectric layer so as to be connected to the at least one semiconductor device, and a second level input/output (I/O) connection electrically coupled to the first level metal interconnect structure and formed on the dielectric layer on a side opposite the at least one semiconductor device, with the second level I/O connection configured to connect the sub-module to an external circuit. The surface-mount structure also includes a multi-layer substrate structure having a first surface and a second surface, wherein the at least one semiconductor device of the sub-module is attached to the first surface of the multi-layer substrate. The surface-mount structure further includes a dielectric material positioned between the dielectric layer and the first surface of the multi-layer substrate structure and at least partially about the at least one semiconductor device of the sub-module and a diffusion barrier layer applied over the sub-module, adjacent to the first and second level I/O connection, and extending down to the multi-layer substrate structure, with the diffusion barrier layer configured to reduce the ingress of moisture and gases from a surrounding environment into the surface-mount structure.

In accordance with another aspect of the invention, a method of manufacturing a surface-mount packaging and interconnect structure includes the step of constructing a sub-module including at least one semiconductor device and a packaging structure formed thereabout, with the step of constructing the sub-module further including the steps of attaching the at least one semiconductor device to a dielectric layer, forming a first-level metallic interconnect structure over the dielectric layer that extends through vias in the dielectric layer to electrically connect to the at least one semiconductor device, and forming a second level input/output (I/O) connection on the dielectric layer on a side opposite the at least one semiconductor device, with the second level I/O connection being configured to connect the sub-module to an external circuit. The method also includes the steps of forming a substrate structure that includes a center substrate layer and first and second metallic layers on opposing sides of the center substrate layer such that the first and second metallic layers form a first surface and a second surface, respectively, of the substrate structure, attaching the sub-module to the first surface of the substrate structure, and providing a dielectric material between the dielectric layer and the first surface of the substrate structure, with the dielectric material at least partially encapsulating the at least one semiconductor device of the sub-module. The method further includes the step of applying a diffusion barrier layer applied over the sub-module, adjacent to the second level I/O connection, and extending down to the multi-layer substrate structure, with the diffusion barrier layer configured to reduce the ingress of moisture and gases from a surrounding environment into the surface-mount packaging and interconnect structure.

In accordance with yet another aspect of the invention, a POL packaging structure includes a POL sub-module having a dielectric layer, a plurality of semiconductor devices attached to the dielectric layer, a first level interconnect structure electrically coupled to the plurality of semiconductor devices that extends through vias formed through the dielectric layer so as to be connected to the plurality of semiconductor devices, and a second level interconnect structure to electrically couple the POL sub-module to an external circuit structure, with the second level interconnect structure comprising a plurality of solder bumps formed over the dielectric layer and first level interconnect structure and configured to make an interconnection to the external circuit structure. The POL packaging structure also includes a multi-layer substrate structure having a first surface and a second surface, wherein the plurality of semiconductor devices of the POL sub-module is attached to the first surface of the multi-layer substrate structure. The multi-layer substrate structure further includes a first direct bond copper (DBC) layer forming the first surface of the multi-layer substrate structure, a second DBC layer forming the second surface of the multi-layer substrate structure, and a ceramic layer sandwiched between the first and second DBC layers. The POL packaging structure further includes an encapsulate positioned between the dielectric layer and the first surface of the multi-layer substrate structure and at least partially about the plurality of semiconductor devices of the sub-module and a diffusion barrier layer applied over the POL sub-module, adjacent to the second level interconnect structure, and extending down to the multi-layer substrate structure, with the diffusion barrier layer configured to reduce the ingress of moisture and gases from a surrounding environment into the POL packaging structure.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for a surface-mount package having a diffusion barrier layer included thereon, as well as a method of forming such a surface-mount package. The surface-mount package is manufactured such that the diffusion barrier layer reduces the ingress of moisture and gases into the package, while still providing for attaching of the surface-mount package to an external circuit.

Figure 1:
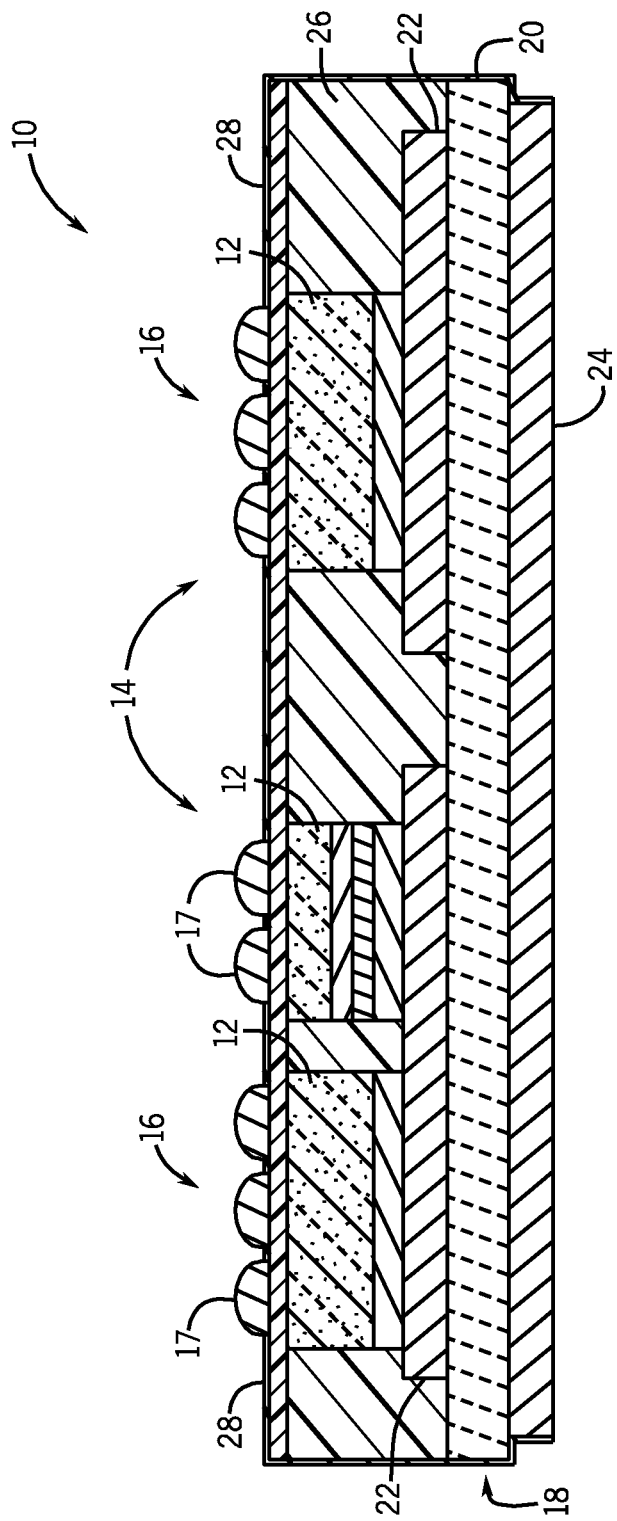
FIG. 1 is a schematic cross-sectional side view of a power overlay (POL) structure according to an embodiment of the invention.

Referring to FIG. 1, a surface-mount packaging and interconnect structure 10 is shown according to an embodiment of the invention. In the embodiment shown in FIG. 1, surface-mount package structure 10 is in the form of a power overlay (POL) structure, although it is recognized that other surface-mount package structures are considered to be within the scope of the invention. The POL structure 10 includes one or more semiconductor device(s) 12 therein that, according to various embodiments, may be in the form of a die, diode, or other power electronic device. As shown in FIG. 1, three semiconductor device(s) 12 are provided in POL structure 10, however, it is recognized that a greater or lesser number of semiconductor devices 12 could be included in POL structure 10. The semiconductor device(s) 12 are packaged within a POL sub-module 14 that forms a direct metallic connection to the power semiconductor device(s) 12, with the connection being in the form of a low profile, planar first-level interconnect structure, for example.

A second-level input-output (I/O) connection 16 is provided on POL sub-module 14 to enable surface mounting of the POL structure 10 to an external circuit, such as a printed circuit board (PCB) (not shown). According to an exemplary embodiment, the second-level I/O connection 16 is formed of land grid array (LGA) solder bumps 17 that are configured to be attached/affixed to the PCB to electrically couple the POL structure 10 to the PCB, although other suitable second-level solder interconnections, such as ball grid array (BGA) solder bumps, could also be used. The LGA solder bumps 17 provide a highly reliable interconnection structure that is resistive to failure in high stress conditions.

As shown in FIG. 1, POL structure 10 also includes a substrate structure 18 to which POL sub-module 14 is attached. According to an exemplary embodiment, the substrate structure 18 is composed of a ceramic tile (e.g., alumina) 20 with a layer of direct bond copper (DBC) 22, 24 bonded to both sides thereof by a high-temperature joining process. For the joining process, different brazing and direct bond technologies may be employed based on, for example, whether tile 20 is composed of alumina or aluminum nitride and silicon nitride, etc. The top DBC layer 22, or "die side DBC layer," of substrate structure 18 is then etched after firing, to pattern the layer as desired based on the number/arrangement of semiconductor devices 12. The bottom DBC layer 24, or "non-die side DBC layer," on the backside of the substrate structure 18 is left fully or partially exposed to provide efficient heat transfer out from the POL structure 10. While referred to above and here below as "DBC layers," it is recognized that aluminum can be used instead of copper as the metal layers, and thus such an embodiment is considered within the scope of the invention. Thus, use of the term "DBC layers" here below is meant to encompass a substrate structure 18 that includes sheets of any suitable metallic material 22, 24 (such as copper or aluminum) bonded to both sides of a ceramic tile (e.g., alumina) 20. As shown in FIG. 1, a dielectric material 26 is also provided on POL structure 10 to fill in gaps in the POL structure 10, so as to provide additional structural integrity to POL structure 10. The dielectric material 26 is generally referred to hereafter as an "underfill material," and in a preferred embodiment is an organic dielectric material that is moisture sensitive and that flows as a liquid prior to curing. However, it is recognized that the dielectric material 26 could be formed of any of a number of suitable materials, including underfills, silicones, molding compounds, encapsulates, or other suitable organic materials.

As shown in FIG. 1, POL structure 10 also includes a diffusion barrier layer 28 that is applied about POL sub-module 14 of POL structure 10. According to embodiments of the invention, diffusion barrier layer 28 is configured to have a low permeability of moisture and gases (e.g., oxygen), so as to significantly reduce the amount of moisture and gases that are absorbed by the materials in the POL sub-module 14, underfill material 26, and at the interfaces between materials in the sub-module, as well as prevent other contaminants from coming in contact with the POL sub-module 14. Additionally, the barrier layer 28 makes the POL structure 10 more reliable to soldering operations (e.g., soldering of second-level I/O connections 16 to a PCB). The diffusion barrier layer 28 is applied adjacent to second-level I/O connections 16 and is applied with a thickness that does not inhibit the soldering of the second-level I/O connections 16 to a PCB. Application of the diffusion barrier layer 28 to POL structure 10 according to various embodiments of the invention is discussed in greater detail below.

Figure 2:
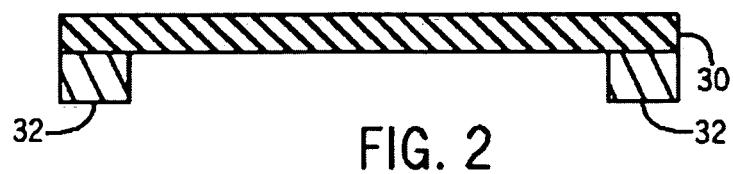
FIGS. 2-9 are schematic cross-sectional side views of a POL structure during various stages of a manufacturing/build-up process according to an embodiment of the invention.

Referring now to FIGS. 2-12, detailed views of the process steps for a technique of manufacturing the POL structure 10 of FIG. 1 are provided, according to an embodiment of the invention. As shown first in FIGS. 2-9, process steps for a build-up of the POL sub-module 14 are provided. Referring to FIG. 2, the build-up process of POL sub-module 14 begins with the placement and attachment of a dielectric layer 30 or "flex layer" onto a frame structure 32. The dielectric layer 30 is in the form of a lamination or film and is placed on frame structure 32 to provide stability during the build-up process of POL sub-module 14. According to embodiments of the invention, the dielectric layer 30 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material.

Figure 3:
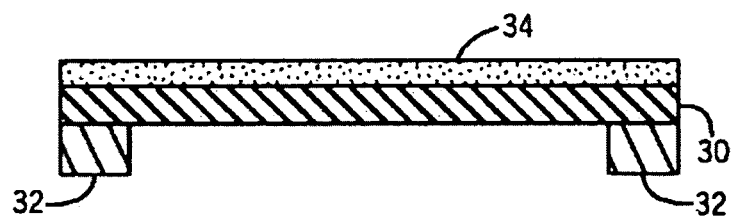
Figure 4:
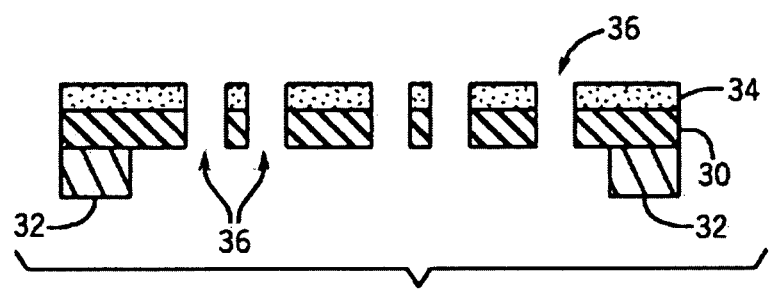
Figure 5:
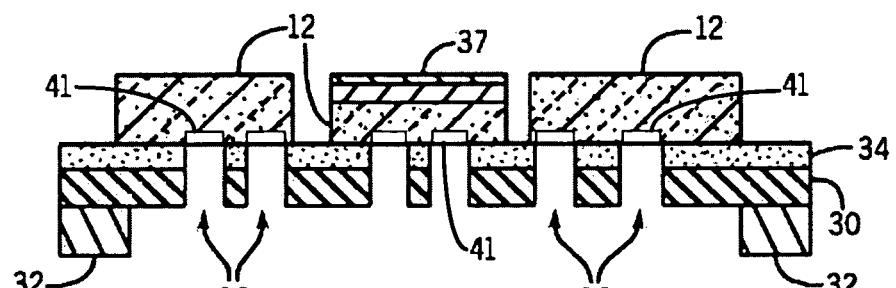

As shown in FIG. 3, upon securing of dielectric layer 30 to frame structure 32, an adhesive layer 34 is deposited onto dielectric layer 30. A plurality of vias 36 is then formed through the adhesive layer 34 and dielectric layer 30, as illustrated in FIG. 4. According to embodiments of the invention, the vias 36 may be formed by way of a laser ablation or laser drilling process, plasma etching, photo-definition, or mechanical drilling processes. In a next step of technique, one or more semiconductor devices 12 (e.g., three semiconductor devices) are secured to dielectric layer 30 by way of adhesive layer 34, as illustrated in FIG. 5. To secure the semiconductor devices 12 to dielectric layer 30, the semiconductor devices 12 are placed onto adhesive layer 34 and the adhesive 34 is then cured to secure the semiconductor device 12 on the dielectric layer 30. According to one embodiment of the invention, and as shown in FIG. 5, semiconductor devices 12 may be of varying thickness/height. In order to increase a thickness/height of a semiconductor device 12, a copper shim 37 may be soldered to one or more of semiconductor devices 12 in order to increase its thickness/height so that the thickness/height of all semiconductor devices 12 is equal and a back surface of the semiconductor devices 12 is "planarized."

While the formation of vias 36 through adhesive layer 34 and dielectric lamination 30 is shown in FIG. 4 as being performed prior to placement of semiconductor devices 12 onto adhesive layer 34, it is recognized that the placement of semiconductor devices 12 could occur prior to via formation. That is, depending on constraints imposed by via size, semiconductor devices 12 could first be placed on adhesive layer 34 and dielectric layer 30, with the vias 36 subsequently being formed at locations corresponding to a plurality of metalized circuits and/or connection pads 41 formed on semiconductor devices 12. Furthermore, a combination of pre- and post-drilled vias could be employed as needed.

Figure 6:
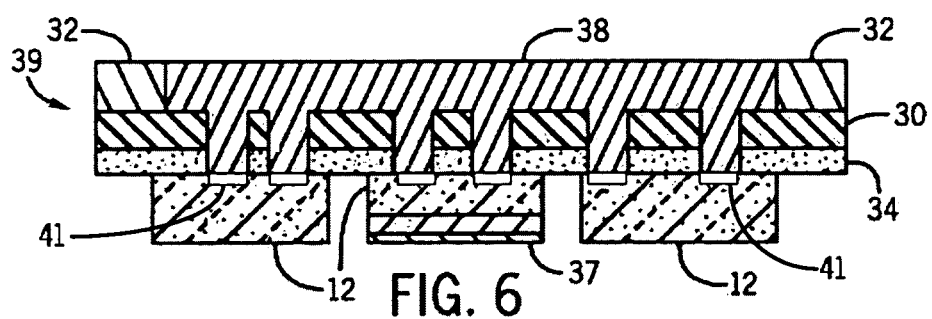
Figure 7:
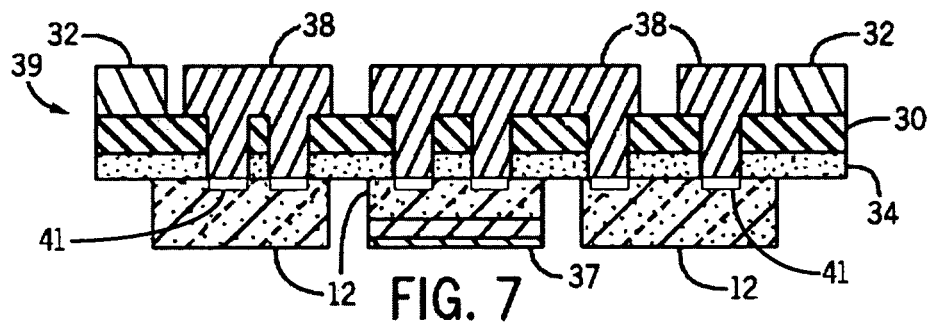

As shown in FIGS. 6 and 7, upon securing of semiconductor devices 12 on the dielectric layer 30 and the formation of vias 36, the vias 36 are cleaned (such as through a reactive ion etching (RIE) desoot process) and subsequently metalized to form first-level interconnects 38. The first-level metal interconnects 38 are typically formed through a combination of sputtering and electroplating applications, although it is recognized that other electroless methods of metal deposition could also be used. For example, a titanium adhesion layer and copper seed layer may first be applied via a sputtering process, followed by an electroplating process that increases a thickness of the copper to a desired level. The applied metal material is then subsequently patterned into metal interconnects 38 (i.e., first level interconnects) having a desired shape and that function as vertical feed-throughs formed through dielectric layer 30 and adhesive layer 34. The metal interconnects 38 extend out from circuits and/or connection pads 41 of semiconductor devices 12, through vias/opening 36, and out across a top surface 39 of dielectric layer 30.

Figure 8:
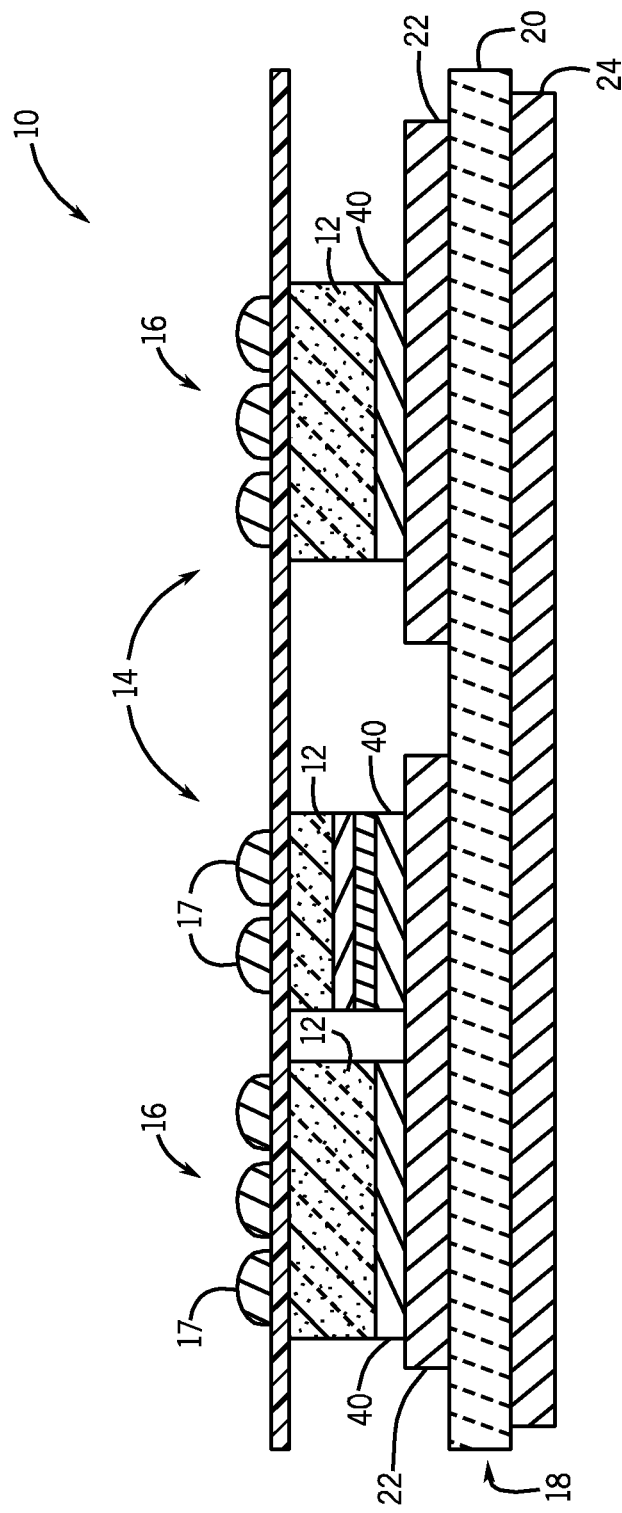
Figure 9:
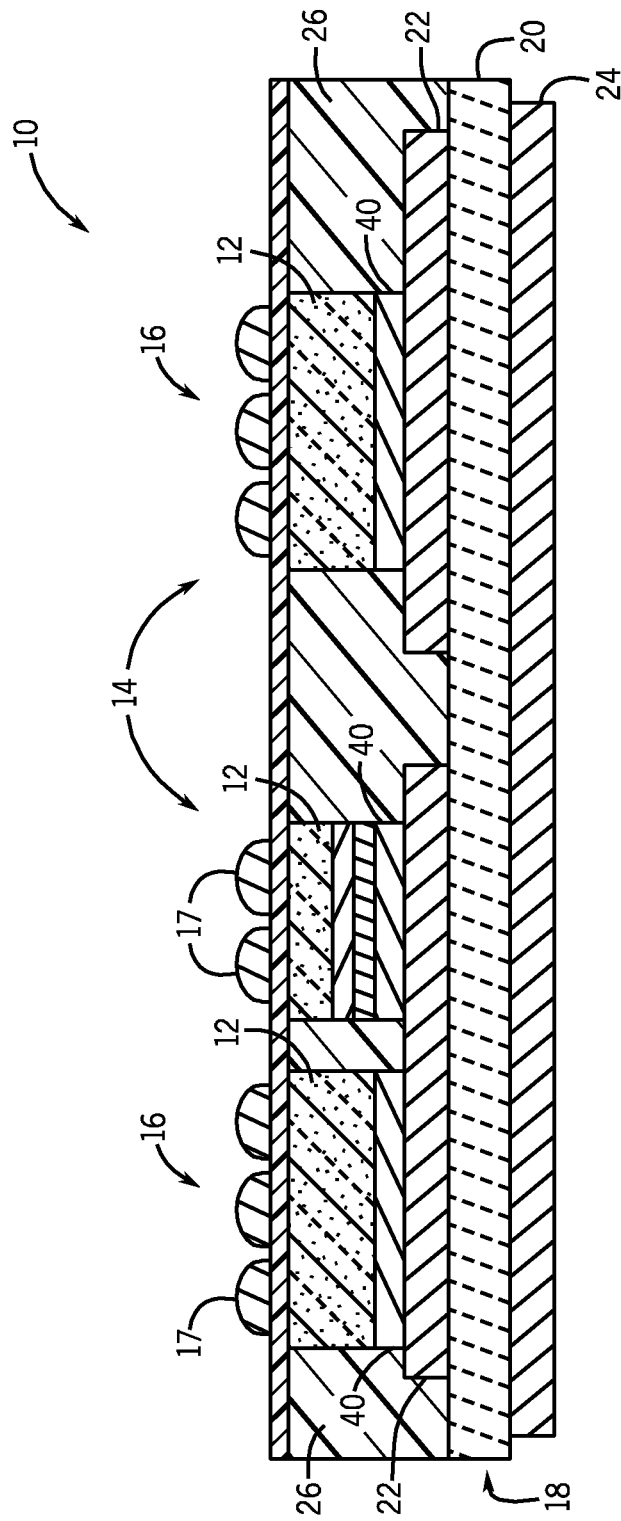

Referring now to FIG. 8, the technique of manufacturing POL structure 10 continues with the attaching of the POL sub-module 14 to substrate structure 18. According to one embodiment of the invention, POL sub-module 14 is attached to substrate structure 18 by way of a solder material 40, so as to secure the POL sub-module 14 and substrate structure 18 together. That is, each of semiconductor devices 12 is soldered to the die side DBC layer 22. A polymeric underfill, encapsulate, or molding compound 26 (e.g., epoxy or other organic filler material) is then provided on POL structure 10 that fills in gaps in the POL structure 10, as shown in FIG. 9, so as to constrain dielectric layer 30 and provide additional electrical insulation and structural integrity to the POL structure 10.

Referring now to FIGS. 10A-10D, various embodiments of a next step in the manufacturing of the POL structure 10 is illustrated in which one or more diffusion barrier layers 28 are applied to the POL structure 10. In each of the various alternative steps shown in FIGS. 10A-10D, diffusion barrier layer 28 is applied to the POL structure 10 to significantly reduce the amount of moisture and gases that are absorbed by the materials in the POL structure 10 and at the interfaces between materials in the structure, as well as prevent other contaminants from coming in contact with the POL sub-module 14. According to embodiments of the invention, the diffusion barrier layer 28 includes one or more layers formed of organic materials, inorganic materials, ceramic materials, and any combination thereof, with these materials typically being reaction or recombination products of reacting plasma species. The layer or stack of layers forming diffusion barrier layer 28 have a low diffusion/transmission of moisture and gas therethrough so as to collectively reduce moisture and gas ingress into the POL structure 10. The diffusion barrier layer 28 may be applied via any of a number of suitable processes, such as a plasma-enhanced chemical vapor deposition process, and has a desired thickness, such as a thickness in the range of one atomic layer up to 25-100 microns, such that the layer 28 does not interfere with the solderability of the LGA/BGA solder bumps 17. The diffusion barrier layer 28 is configured as an electrically non-conductive layer that is applied at a low temperature, such as a temperature that does not exceed approximately 250-300 degrees Celsius, for example.

Figure 10A:
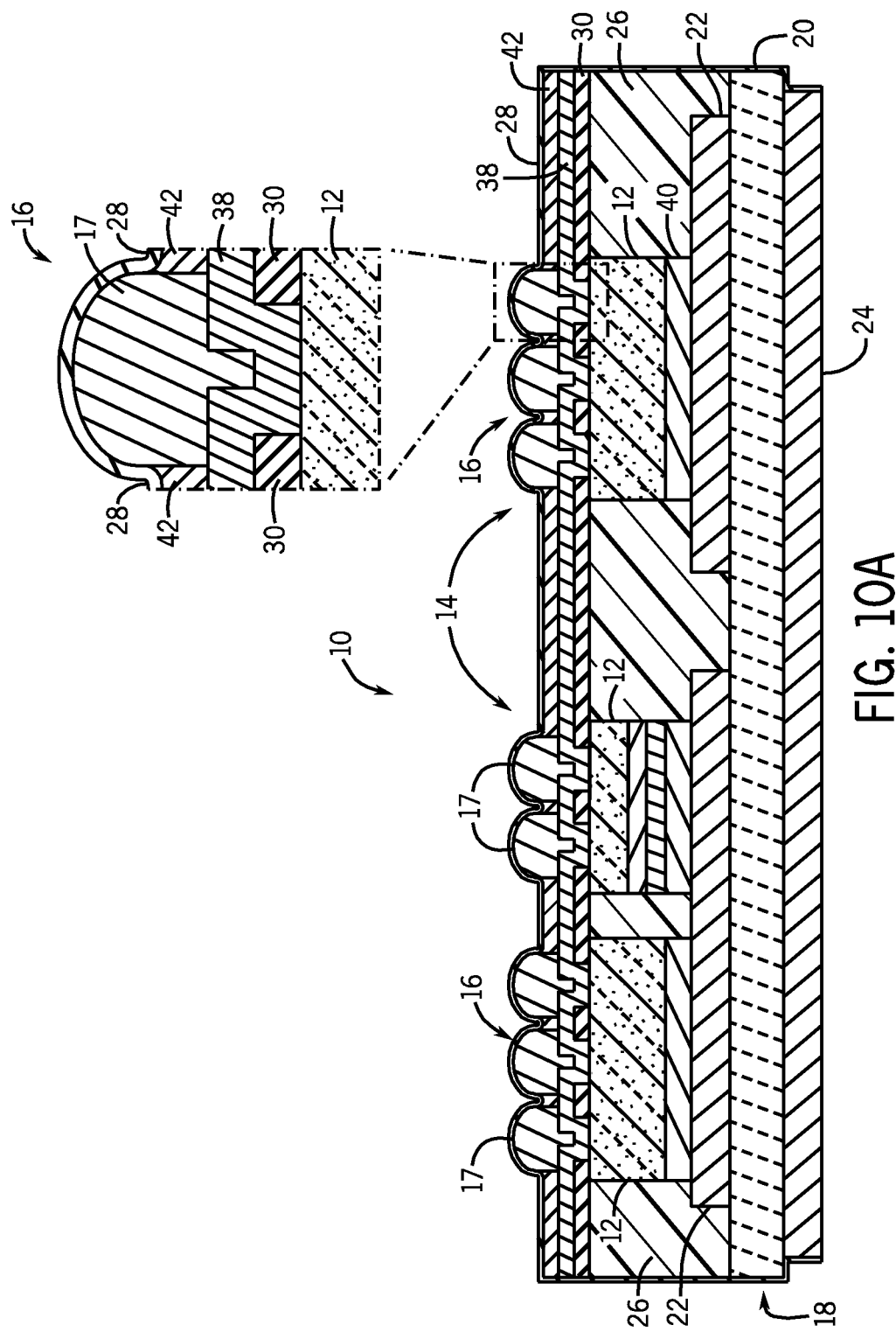
FIGS. 10A-10D are schematic cross-sectional side views of a POL structure having a diffusion barrier layer applied thereto according to embodiments of the invention.

Referring to FIG. 10A, according to one embodiment of the invention, upon attaching of the POL sub-module 14 to substrate structure 18 and the deposition of underfill material 26, a solder mask layer 42 is applied over the patterned metal interconnects 38 on POL sub-module 14 to provide a protective coating for the copper shims thereof. Alternative to solder, it is recognized that the layer 42 could be composed of some metal material other than solder, such as Ni or Ni/Au. As further shown in FIG. 10A, the second-level I/O interconnections 16 are then applied to solder mask 42, on top of the dielectric layer 30. In one embodiment, I/O interconnections 16 are formed as LGA or BGA solder bumps 17 that are soldered to solder mask 42 to enable surface mounting of the POL structure 10 to an external circuit, with the solder bumps 17 providing a highly reliable second-level interconnection structure that is resistive to failure in high stress conditions. Upon application of solder mask 42 and second-level I/O interconnections 16, diffusion barrier layer 28 is then applied to the POL structure 10. The diffusion barrier layer 28 is applied over solder mask 42 and the solder bumps 17 of second-level I/O interconnection 16, without any need for patterning the layer. The diffusion barrier layer 28 also extends down the sides of the POL structure 10 and to the ceramic layer 20 or backside DBC layer 24, such that the underfill material 26 is also covered by the diffusion barrier layer 28 and the POL structure 10 is enclosed by the barrier layer 28.

Figure 10B:
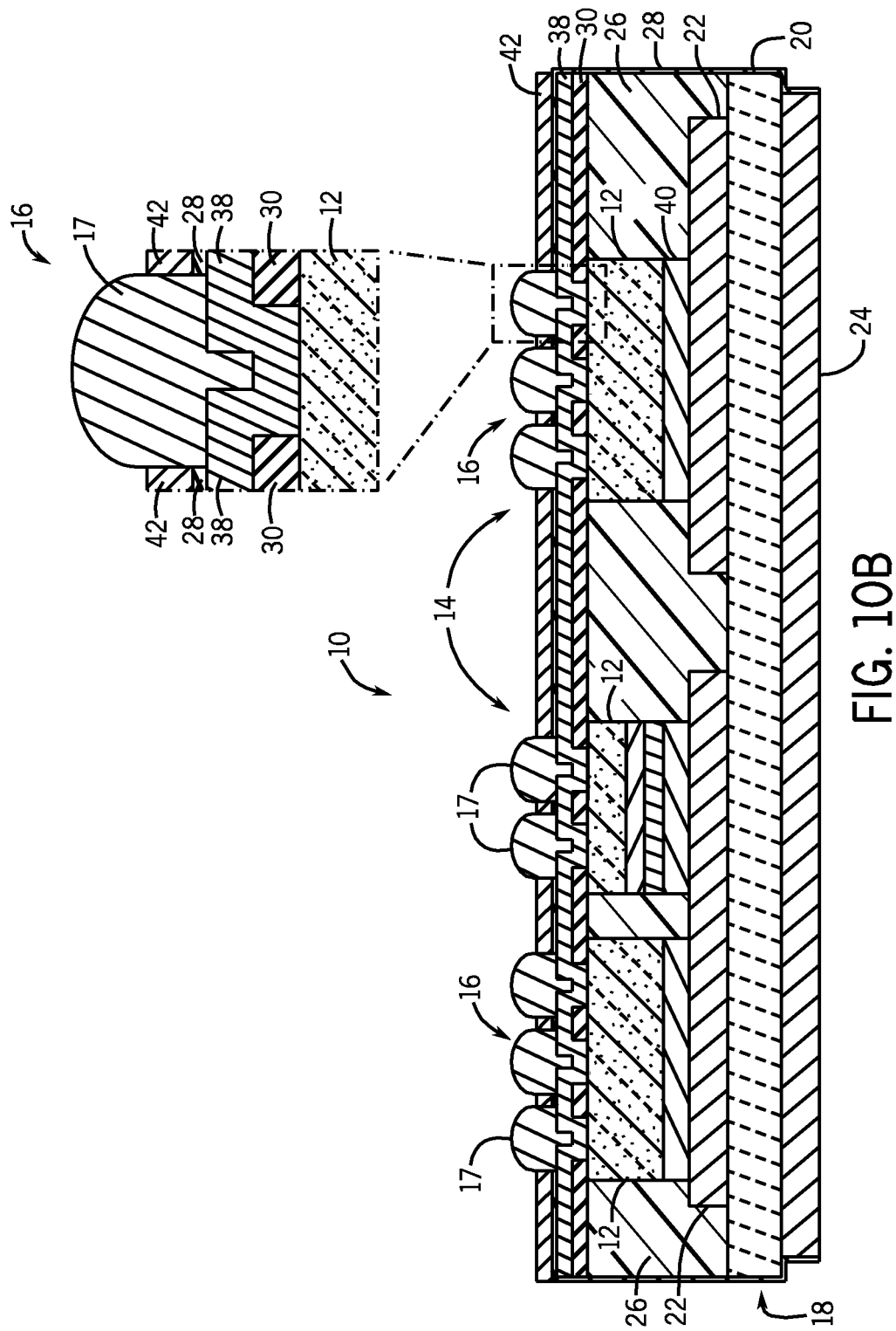

Referring to FIG. 10B, according to another embodiment of the invention, upon attaching of the POL sub-module 14 to substrate structure 18 and the deposition of underfill material 26, diffusion barrier layer 28 is applied to the POL structure 10 directly onto the metal interconnects 38. A solder mask layer 42 is then applied over the diffusion barrier layer 28 to provide a protective coating for the copper shims thereof, with the solder mask layer 42 also being used to etch the diffusion barrier layer 28 to open at locations where the LGA solder bumps 17 are to be formed. As further shown in FIG. 10B, the second-level I/O interconnections 16 are applied to solder mask 42, on top of the dielectric layer 30 and on top of diffusion barrier layer 28, with the interconnections being in the form of LGA or BGA solder bumps 17 that are soldered to solder mask 42 to enable surface mounting of the POL structure 10 to an external circuit. The diffusion barrier layer 28 extends down the sides of the POL structure 10 and to the ceramic layer 20 or backside DBC layer 24, such that the underfill material 26 is also covered by the diffusion barrier layer 28 and the POL structure 10 is enclosed by the barrier layer.

Figure 10C:
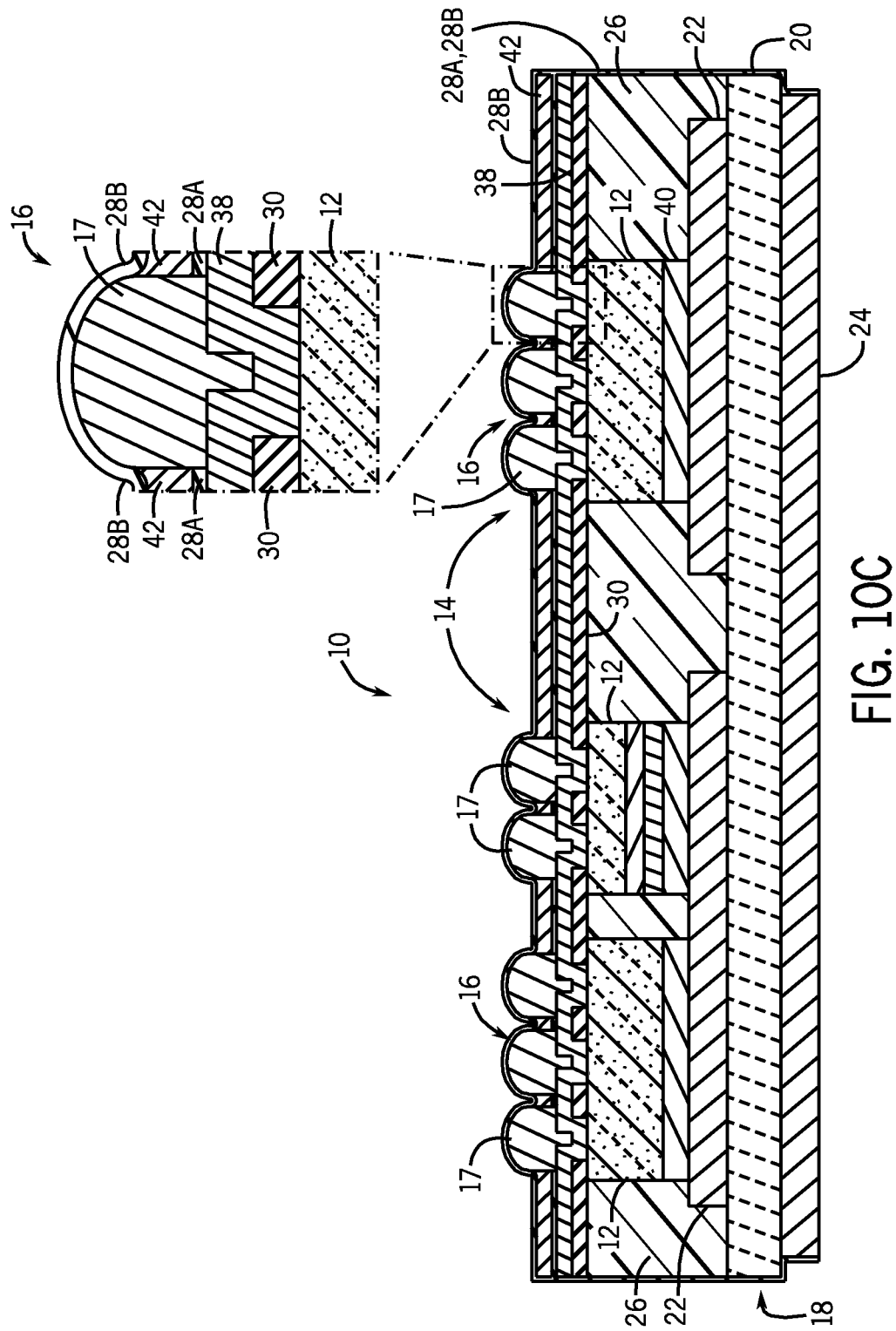

Referring to FIG. 10C, according to another embodiment of the invention, multiple diffusion barrier layers 28 are applied onto POL structure 10 at various stages of the manufacturing process. That is, a first diffusion barrier layer 28A is applied to the POL structure 10 directly onto the metal interconnects 38. A solder mask layer 42 is then applied over the diffusion barrier layer 28A to provide a protective coating for the copper shims thereof, with the second-level I/O interconnections 16 then being applied to solder mask 42 on top of the dielectric layer 30 and on top of the first diffusion barrier layer 28A, with the interconnections being in the form of LGA or BGA solder bumps 17. Upon application of solder mask 42 and second-level I/O interconnections 16, a second diffusion barrier layer 28B is then applied to the sub-module, with the second diffusion barrier layer 28B being applied over solder mask 42 and the solder bumps 17 of second-level I/O interconnection 16, without any need for patterning the layer. The second diffusion barrier layer 28B is configured such that the layer does not interfere with the solderability of the LGA/BGA solder bumps 17. Additionally, the first and/or second diffusion barrier layers 28A, 28B extend down the sides of the POL structure and to the ceramic layer 20 or backside DBC layer 24, such that the underfill material 26 is also covered by the diffusion barrier layer and the POL structure 10 is enclosed by the barrier layer.

Figure 10D:
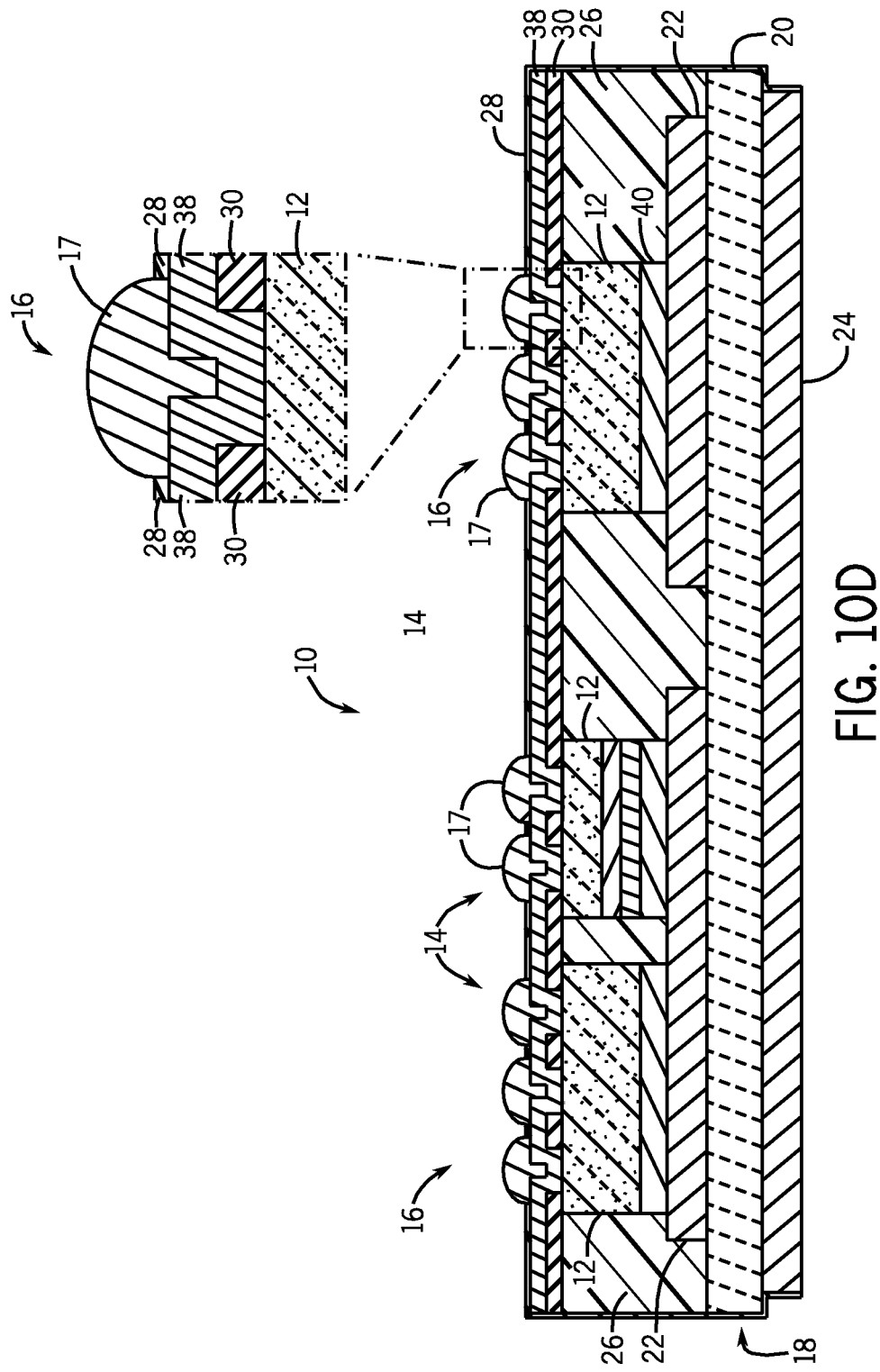

Referring to FIG. 10D, according to another embodiment of the invention, upon attaching of the POL sub-module 14 to substrate structure 18 and the deposition of underfill material 26, diffusion barrier layer 28 is applied to the POL structure 10 directly onto the metal interconnects 38 and is configured to act as a solder mask. In replacing the function of the traditional solder mask, a thickness of diffusion barrier layer 28 is increased such that the barrier layer provides adequate protection to metal interconnects 38. Upon application of the diffusion barrier layer 28, the second-level I/O interconnections 16 are formed thereover, with the interconnections being in the form of LGA or BGA solder bumps 17.

Figure 11A:
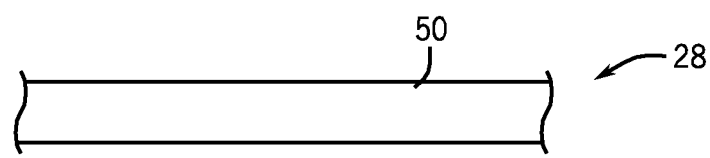
FIGS. 11A-11C are schematic cross-sectional side views of a diffusion barrier layer according to embodiments of the invention.
Figure 11B:
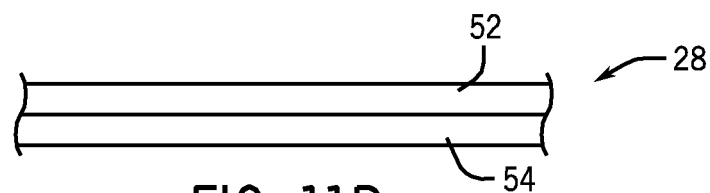
Figure 11C:
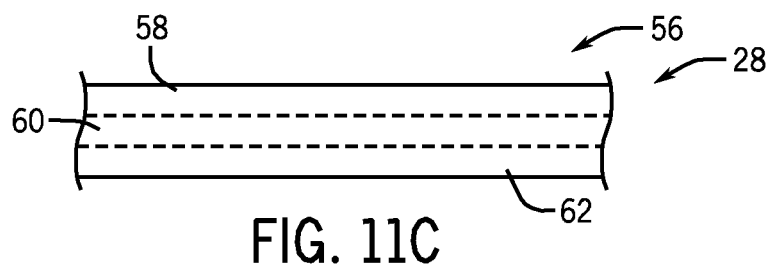

Referring now to FIGS. 11A-11C, various envisioned constructions of the diffusion barrier layer 28 are shown according to embodiments of the invention. As set forth above, the diffusion barrier layer 28 includes one or more layers formed of organic materials, inorganic materials, ceramic materials, and any combination thereof, with these materials typically being reaction or recombination products of reacting plasma species.

As shown in FIG. 11A, the diffusion barrier layer 28 may be constructed as a single layer 50 having a consistent composition throughout. According to one embodiment, the single layer 50 may be formed of inorganic and/or ceramic materials only, with the inorganic/ceramic materials comprising any of oxides, nitrides, carbides, and borides of elements of Groups IIA, IIIA, IVA, VA, VIA, VIIA, IB, IIB, metals of Groups IIIB, IVB, VB, rare earth elements, or any combination thereof.

As shown in FIG. 11B, the diffusion barrier layer 28 may instead be constructed as a stack of layers 52, 54 (i.e., a multi-layer construction), such as a first layer 52 and a second layer 54, although it is recognized that additional layers could be constructed. According to one embodiment, the first layer 52 may be formed of one or more organic materials, such as carbon, hydrogen, oxygen, and optionally other minor elements, such as sulfur, nitrogen, silicon, etc., depending on the types of reactants used therewith, with suitable reactants that result in organic compositions in the coating being straight or branched alkanes, alkenes, alkynes, alcohols, aldehydes, ethers, alkylene oxides, aromatics, etc., having up to 15 carbon atoms. The second layer 54 may be formed of inorganic and/or ceramic materials, with the inorganic/ceramic materials comprising any of oxides, nitrides, carbides, and borides of elements of Groups IIA, IIIA, IVA, VA, VIA, VIIA, IB, IIB, metals of Groups IIIB, IVB, VB, rare earth elements, or any combination thereof.

As shown in FIG. 11C, according to yet another embodiment, the diffusion barrier layer 28 may be constructed as a layer 56 having a graded composition, i.e., the composition of the layer 56 varies across a thickness of the layer, such that layer 56 can be termed as having a plurality of regions 58, 60, 62. Suitable coating compositions of regions 58, 60, 62 across the thickness of layer 56 are organic, inorganic, or ceramic materials, such as the organic, inorganic, and ceramic materials set forth above. For example, silicon carbide can be deposited onto a substrate by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), hexamethyldisiloxane (HMDSO), hexamethyldisilazane (HMDSN), or octamethylcyclotetrasiloxane ($D_4$). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired composition of layer 56. A graded composition of the layer 56 is obtained by changing the compositions of the reactants fed into the reactor chamber during the deposition of reaction products to form the layer.

Beneficially, embodiments of the invention thus provide a POL packaging and interconnect structure 10 having second-level package I/O's 16 that are provided on the flex side (i.e., on top of dielectric layer 30) of the POL sub-module 14 for second-level interconnection to an external circuit and the entire non-die side DBC layer 24 is available for thermal connection. The POL structure 10 includes a diffusion barrier layer 28 configured to reduce the ingress of moisture and gases into the package, so as to provide enhanced reliability to moisture and gas related failure mechanisms. The diffusion barrier layer 28 is further configured such that it does not interfere with the solderability of the second-level I/O interconnections 16 to a PCB or other external circuit.

Therefore, according to one embodiment of the invention, a surface-mount structure includes a sub-module having a dielectric layer, at least one semiconductor device attached to the dielectric layer that includes a substrate composed of a semiconductor material, a first level metal interconnect structure electrically coupled to the at least one semiconductor device that extends through vias formed through the dielectric layer so as to be connected to the at least one semiconductor device, and a second level input/output (I/O) connection electrically coupled to the first level metal interconnect structure and formed on the dielectric layer on a side opposite the at least one semiconductor device, with the second level I/O connection configured to connect the sub-module to an external circuit. The surface-mount structure also includes a multi-layer substrate structure having a first surface and a second surface, wherein the at least one semiconductor device of the sub-module is attached to the first surface of the multi-layer substrate. The surface-mount structure further includes a dielectric material positioned between the dielectric layer and the first surface of the multi-layer substrate structure and at least partially about the at least one semiconductor device of the sub-module and a diffusion barrier layer applied over the sub-module, adjacent to the first and second level I/O connection, and extending down to the multi-layer substrate structure, with the diffusion barrier layer configured to reduce the ingress of moisture and gases from a surrounding environment into the surface-mount structure.

According to another embodiment of the invention, a method of manufacturing a surface-mount packaging and interconnect structure includes the step of constructing a sub-module including at least one semiconductor device and a packaging structure formed thereabout, with the step of constructing the sub-module further including the steps of attaching the at least one semiconductor device to a dielectric layer, forming a first-level metallic interconnect structure over the dielectric layer that extends through vias in the dielectric layer to electrically connect to the at least one semiconductor device, and forming a second level input/output (I/O) connection on the dielectric layer on a side opposite the at least one semiconductor device, with the second level I/O connection being configured to connect the sub-module to an external circuit. The method also includes the steps of forming a substrate structure that includes a center substrate layer and first and second metallic layers on opposing sides of the center substrate layer such that the first and second metallic layers form a first surface and a second surface, respectively, of the substrate structure, attaching the sub-module to the first surface of the substrate structure, and providing a dielectric material between the dielectric layer and the first surface of the substrate structure, with the dielectric material at least partially encapsulating the at least one semiconductor device of the sub-module. The method further includes the step of applying a diffusion barrier layer applied over the sub-module, adjacent to the second level I/O connection, and extending down to the multi-layer substrate structure, with the diffusion barrier layer configured to reduce the ingress of moisture and gases from a surrounding environment into the surface-mount packaging and interconnect structure.

According to yet another embodiment of the invention, a POL packaging structure includes a POL sub-module having a dielectric layer, a plurality of semiconductor devices attached to the dielectric layer, a first level interconnect structure electrically coupled to the plurality of semiconductor devices that extends through vias formed through the dielectric layer so as to be connected to the plurality of semiconductor devices, and a second level interconnect structure to electrically couple the POL sub-module to an external circuit structure, with the second level interconnect structure comprising a plurality of solder bumps formed over the dielectric layer and first level interconnect structure and configured to make an interconnection to the external circuit structure. The POL packaging structure also includes a multi-layer substrate structure having a first surface and a second surface, wherein the plurality of semiconductor devices of the POL sub-module is attached to the first surface of the multi-layer substrate structure. The multi-layer substrate structure further includes a first direct bond copper (DBC) layer forming the first surface of the multi-layer substrate structure, a second DBC layer forming the second surface of the multi-layer substrate structure, and a ceramic layer sandwiched between the first and second DBC layers. The POL packaging structure further includes an encapsulate positioned between the dielectric layer and the first surface of the multi-layer substrate structure and at least partially about the plurality of semiconductor devices of the sub-module and a diffusion barrier layer applied over the POL sub-module, adjacent to the second level interconnect structure, and extending down to the multi-layer substrate structure, with the diffusion barrier layer configured to reduce the ingress of moisture and gases from a surrounding environment into the POL packaging structure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A surface-mount structure comprising:
    a sub-module, the sub-module comprising:
        a dielectric layer;
        an adhesive layer directly attached to the dielectric layer;
        at least one semiconductor device adhered to the dielectric layer via the adhesive layer, with each of the at least one semiconductor device including a substrate composed of a semiconductor material;
        a first level metal interconnect structure electrically coupled to the at least one semiconductor device, the metal interconnect structure extending through vias formed through the dielectric layer so as to be connected to the at least one semiconductor device; and
        a second level input/output (I/O) connection electrically coupled to the first level metal interconnect structure and formed on the dielectric layer on a side opposite the at least one semiconductor device, the second level I/O connection configured to connect the sub-module to an external circuit;
    a multi-layer substrate structure having a first surface and a second surface, wherein the at least one semiconductor device of the sub-module is attached to the first surface of the multi-layer substrate;
    a dielectric material positioned between the dielectric layer and the first surface of the multi-layer substrate structure and at least partially about the at least one semiconductor device of the sub-module; and
    a diffusion barrier layer applied over the sub-module, adjacent to the first and second level I/O connections, and extending down to the multi-layer substrate structure, the diffusion barrier layer configured to reduce the ingress of moisture and gases from a surrounding environment into the surface-mount structure.

2. The surface-mount structure of claim 1 wherein the diffusion barrier layer comprises organic materials, inorganic materials, ceramic materials, and any combination thereof.

3. The surface-mount structure of claim 2 wherein the inorganic material or ceramic comprises oxides, nitrides, carbides, and borides of elements of Groups IIA, IIIA, IVA, VA, VIA, VIIA, IB, IIB, metals of Groups IIIB, IVB, VB, rare earth elements, and any combination thereof.

4. The surface-mount structure of claim 1 wherein the diffusion barrier layer comprises a single layer barrier.

5. The surface-mount structure of claim 1 further comprising a solder mask applied over the first level metal interconnect structure; and
    wherein the second level I/O connection comprises one of land grid array (LGA) solder bumps and ball grid array (BGA) solder bumps configured to pass through the solder mask at desired locations so as to be electrically coupled to the first level metal interconnect structure.

6. The surface-mount structure of claim 5 wherein the diffusion barrier layer is applied between the first level metal interconnect structure and the solder mask.

7. The surface-mount structure of claim 5 wherein the diffusion barrier layer is applied over the solder mask and over or around the solder bumps of the second level I/O connection.

8. The surface-mount structure of claim 1 wherein the diffusion barrier layer is applied over the first level metal interconnect structure and is further configured to function as a solder mask.

9. The surface-mount structure of claim 1 wherein the diffusion barrier layer has a thickness of between one atomic layer and 100 microns.

10. The surface-mount structure of claim 1 wherein the multi-layer substrate structure comprises:
    a ceramic insulating layer;
    a first metallic layer positioned on one side of the insulating layer to form the first surface of the multi-layer substrate structure; and
    a second metallic layer positioned on another side of the insulating layer to form the second surface of the multi-layer substrate structure;
    wherein the first and second metallic layers comprise first and second direct bond copper (DBC) layers.

11. The surface-mount structure of claim 1 wherein the sub-module comprises a power overlay (POL) sub-module.

12. A method of manufacturing a surface-mount packaging and interconnect structure comprising:
    constructing a sub-module including at least one semiconductor device and a packaging structure formed thereabout, wherein constructing the sub-module comprises:
        applying an adhesive layer directly to a dielectric layer;
        adhering the at least one semiconductor device to the dielectric layer via the adhesive layer;
        forming a first-level metallic interconnect structure over the dielectric layer, the first-level metallic interconnect structure extending through vias in the dielectric layer to electrically connect to the at least one semiconductor device; and
        forming a second level input/output (I/O) connection on the dielectric layer on a side opposite the at least one semiconductor device, the second level I/O connection configured to connect the sub-module to an external circuit;
    forming a substrate structure that includes a center substrate layer and first and second metallic layers on opposing sides of the center substrate layer, such that the first and second metallic layers form a first surface and a second surface, respectively, of the substrate structure;
    attaching the sub-module to the first surface of the substrate structure;
    providing a dielectric material between the dielectric layer and the first surface of the substrate structure, the dielectric material at least partially encapsulating the at least one semiconductor device of the sub-module; and
    applying a diffusion barrier layer applied over the sub-module, adjacent to the second level I/O connection, and extending down to the multi-layer substrate structure, the diffusion barrier layer configured to reduce the ingress of moisture and gases from a surrounding environment into the surface-mount packaging and interconnect structure.

13. The method of claim 12 further comprising applying a solder mask over the first level metal interconnect structure, with the second level I/O connection extending through the solder mask at pre-determined locations.

14. The method of claim 13 wherein applying the diffusion barrier layer comprises applying the diffusion barrier layer between the first level metal interconnect structure and the solder mask.

15. The method of claim 13 wherein applying the diffusion barrier layer comprises applying the diffusion barrier layer over the solder mask and over or around the second level I/O connection.

16. The method of claim 12 wherein applying the diffusion barrier layer comprises applying one or more layers of an organic material, an inorganic material, a ceramic material, or any combination thereof.

17. The method of claim 12 wherein the diffusion barrier layer is applied to have a thickness of between one atomic layer and 100 microns.

18. A power overlay (POL) packaging structure comprising:
- a POL sub-module, the POL sub-module comprising:
  - a dielectric layer;
  - a plurality of semiconductor devices adhered to the dielectric layer via an adhesive layer, wherein the adhesive layer is directly attached to the dielectric layer;
  - a first level interconnect structure electrically coupled to the plurality of semiconductor devices, the first level interconnect structure extending through vias formed through the dielectric layer so as to be connected to the plurality of semiconductor devices; and
  - a second level interconnect structure to electrically couple the POL sub-module to an external circuit structure, the second level interconnect structure comprising a plurality of solder bumps formed over the dielectric layer and first level interconnect structure and configured to make an interconnection to the external circuit structure;
- a multi-layer substrate structure having a first surface and a second surface, wherein the plurality of semiconductor devices of the POL sub-module is attached to the first surface of the multi-layer substrate structure, and wherein the multi-layer substrate structure includes:
  - a first direct bond copper (DBC) layer forming the first surface of the multi-layer substrate structure;
  - a second DBC layer forming the second surface of the multi-layer substrate structure; and
  - a ceramic layer sandwiched between the first and second DBC layers;
- an encapsulate positioned between the dielectric layer and the first surface of the multi-layer substrate structure and at least partially about the plurality of semiconductor devices of the sub-module; and
- a diffusion barrier layer applied over the POL sub-module, adjacent to the second level interconnect structure, and extending down to the multi-layer substrate structure, the diffusion barrier layer configured to reduce the ingress of moisture and gases from a surrounding environment into the POL packaging structure.

19. The POL packaging structure of claim 18 further comprising a solder mask applied over the first level metal interconnect structure, wherein the diffusion barrier layer is applied in at least one of a position between the first level metal interconnect structure and the solder mask and a position over the solder mask and over the plurality of solder bumps.

20. The POL packaging structure of claim 18 wherein the diffusion barrier layer consists of organic materials, inorganic materials, ceramic materials, and any combination thereof.

21. The surface-mount structure of claim 1 wherein the first level metal interconnect structure extends out from connection pads of each of the at least one semiconductor device, through a plurality of vias formed in the dielectric layer, and across the dielectric layer on the side opposite the at least one semiconductor device.

22. The surface-mount structure of claim 1 wherein the diffusion barrier layer comprises a multi-layer barrier.

23. The surface-mount structure of claim 1 wherein the diffusion barrier layer comprises a graded composition barrier having a composition that varies across a thickness of the diffusion barrier layer between organic and inorganic materials.

* * * * *